(12) United States Patent
Wong et al.

(10) Patent No.: US 11,764,271 B2
(45) Date of Patent: Sep. 19, 2023

(54) MINIATURE FIELD PLATE T-GATE AND METHOD OF FABRICATING THE SAME

(71) Applicant: HRL Laboratories, LLC, Malibu, CA (US)

(72) Inventors: Joel C. Wong, Simi Valley, CA (US); Jeong-Sun Moon, Malibu, CA (US); Robert M. Grabar, Malibu, CA (US); Michael T. Antcliffe, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/684,948

(22) Filed: Mar. 2, 2022

(65) Prior Publication Data

US 2022/0190123 A1 Jun. 16, 2022

Related U.S. Application Data

(62) Division of application No. 16/773,090, filed on Jan. 27, 2020, now Pat. No. 11,302,786.
(Continued)

(51) Int. Cl.
*H01L 29/40* (2006.01)
*H01L 29/20* (2006.01)
(Continued)

(52) U.S. Cl.
CPC ...... *H01L 29/404* (2013.01); *H01L 21/28587* (2013.01); *H01L 21/31111* (2013.01);
(Continued)

(58) Field of Classification Search
None
See application file for complete search history.

(56) References Cited

U.S. PATENT DOCUMENTS 5,712,175 A 1/1998 Yoshida
5,766,967 A 6/1998 Lai
(Continued)

FOREIGN PATENT DOCUMENTS

CN 101005019 A 7/2007
CN 109103245 7/2018
(Continued)

OTHER PUBLICATIONS

Office Action from Chinese Patent Application No. 202080021166.5 dated May 31, 2022 with search report and its English translation.
(Continued)

*Primary Examiner* — Scott B Geyer
(74) *Attorney, Agent, or Firm* — Ladas & Parry, LLP

(57) ABSTRACT

A method of fabricating a gate with a mini field plate includes forming a dielectric passivation layer over an epitaxy layer on a substrate, coating the dielectric passivation layer with a first resist layer, etching the first resist layer and the dielectric passivation layer to form a first opening in the dielectric passivation layer, removing the first resist layer; and forming a tri-layer gate having a gate foot in the first opening, the gate foot having a first width, a gate neck extending from the gate foot and extending for a length over the dielectric passivation layer on both sides of the first opening, the gate neck having a second width wider than the first width of the gate foot, and a gate head extending from the gate neck, the gate head having a third width wider than the second width of the gate neck.

10 Claims, 3 Drawing Sheets

Related U.S. Application Data

(60) Provisional application No. 62/829,192, filed on Apr. 4, 2019.

(51) Int. Cl.

| | |
|---|---|
| *H01L 29/205* | (2006.01) |
| *H01L 29/41* | (2006.01) |
| *H01L 29/423* | (2006.01) |
| *H01L 29/66* | (2006.01) |
| *H01L 21/285* | (2006.01) |
| *H01L 21/311* | (2006.01) |
| *H01L 21/765* | (2006.01) |
| *H01L 29/778* | (2006.01) |

(52) U.S. Cl.
CPC ...... *H01L 21/31144* (2013.01); *H01L 21/765* (2013.01); *H01L 29/2003* (2013.01); *H01L 29/205* (2013.01); *H01L 29/413* (2013.01); *H01L 29/42316* (2013.01); *H01L 29/66462* (2013.01); *H01L 29/7786* (2013.01)

(56) References Cited

U.S. PATENT DOCUMENTS

| | | | |
|---|---|---|---|
| 7,084,021 B2 | 8/2006 | Janke | |
| 7,557,389 B2 | 7/2009 | Amasuga | |
| 7,592,211 B2* | 9/2009 | Sheppard | ............ H01L 29/7787 |
| | | | 257/E21.403 |
| 8,049,252 B2 | 11/2011 | Smith | |
| 8,741,715 B2 | 6/2014 | Moore | |
| 9,142,626 B1 | 9/2015 | Corrion | |
| 9,148,092 B1 | 9/2015 | Brown | |
| 9,577,064 B2 | 2/2017 | Peroni | |
| 9,929,243 B1 | 3/2018 | Corrion | |
| 10,084,074 B1 | 9/2018 | Yang | |
| 11,302,786 B2 | 4/2022 | Wong | |
| 2007/0134862 A1 | 6/2007 | Lim | |
| 2007/0164322 A1 | 7/2007 | Smith | |
| 2007/0267655 A1 | 11/2007 | Endoh | |
| 2008/0124852 A1 | 5/2008 | Ahn | |
| 2009/0159930 A1 | 6/2009 | Smorchkova | |
| 2010/0184262 A1 | 7/2010 | Smorchkova | |
| 2011/0018040 A1 | 1/2011 | Smith | |
| 2011/0049526 A1 | 3/2011 | Chu | |
| 2013/0146944 A1 | 6/2013 | Yoon | |
| 2013/0189817 A1* | 7/2013 | Peroni | ................ H01L 29/402 |
| | | | 438/172 |
| 2013/0193487 A1 | 8/2013 | Peroni | |
| 2013/0277680 A1 | 10/2013 | Green | |
| 2013/0313561 A1* | 11/2013 | Suh | ................ H01L 29/7787 |
| | | | 257/E21.403 |
| 2014/0084363 A1* | 3/2014 | Pearse | ................ H01L 29/7813 |
| | | | 257/330 |
| 2014/0159050 A1* | 6/2014 | Yoon | ................ H01L 21/28264 |
| | | | 438/172 |
| 2015/0194494 A1 | 7/2015 | Ahn | |
| 2015/0303291 A1 | 10/2015 | Makiyama | |
| 2015/0311084 A1 | 10/2015 | Moore | |
| 2016/0149006 A1* | 5/2016 | Bettencourt | .......... H01L 29/778 |
| | | | 257/194 |
| 2016/0240645 A1 | 8/2016 | Prechtl | |
| 2018/0090575 A1 | 3/2018 | Makiyama | |
| 2018/0182878 A1* | 6/2018 | Morvan | ............ H01L 29/66462 |
| 2020/0243667 A1 | 7/2020 | Koyama | |

FOREIGN PATENT DOCUMENTS

| | | | | |
|---|---|---|---|---|
| CN | 109103245 A | * | 12/2018 | ........... H01L 29/401 |
| KR | 20110088860 | | 8/2011 | |

OTHER PUBLICATIONS

David F. Brown et al., "High-Speed, Enhancement-Mode GaN Power Switch With Regrown n+ GaN Ohmic Contacts and Staircase Field Plates", IEEE Electron Device Letters, vol. 34, No. 9, pp. 1118-1120, Sep. 2013.

Kengo Kobayashi et al., "Current Collapse Suppression in AlGaN/GaN HEMTs by Means of Slant Field Plates Fabricated by Multi-layer SiCN", Solid State Electronics, vol. 101, pp. 63-69, Nov. 2014.

Y. Pei et al., "Deep-Submicrometer AlGaN/GaN HEMTs With Slant Field Plates", IEEE Electron Device Letters, vol. 30, No. 4, pp. 328-330, Apr. 2009.

Joel Wong et al., "Novel Asymmetric Slant Field Plate Technology for High-Speed Low-Dynamic Ron E/D-mode GaN HEMTs", IEEE Electron Device Letters, vol. 38, No. 1, pp. 95-98, Jan. 2017.

G. Xie et al., "Breakdown voltage enhancement for power AlGaN/GaN HEMTs with Air-bridge Field Plate", 2011 IEEE International Conference of Electron Devices and Solid- State Circuits, Nov. 17-18, 2011.

Non-Final Office Action in U.S. Appl. No. 16/773,090, dated Jul. 9, 2021.

From U.S. Appl. No. 16/773,090 (now U.S. Pat. No. 11,302,786), Notice of Allowance dated Dec. 6, 2021.

From U.S. Appl. No. 16/773,090 (now U.S. Pat. No. 11,302,786), Notice of Allowance dated Sep. 27, 2021.

PCT International Search Report from PCT/US2020/015252 dated Nov. 10, 2020.

PCT International Preliminary Report on Patentability (Chapter I) with Written Opinion from PCT/US2020/015252 dated Oct. 14, 2021.

Extended European Search Report from EPO Patent Application No. 20790615.7 dated Apr. 12, 2023.

* cited by examiner

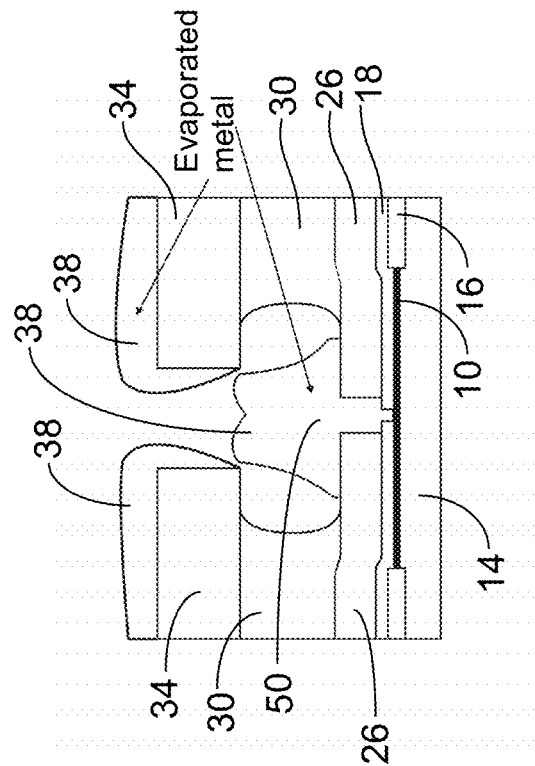
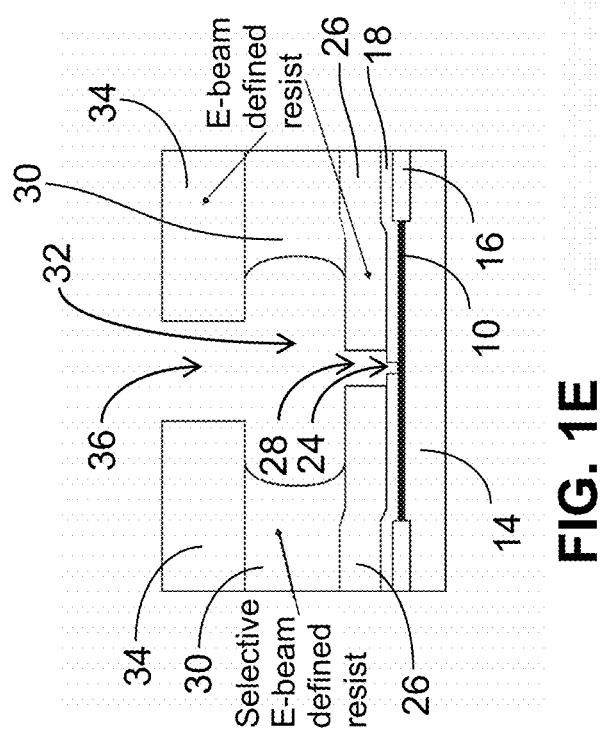
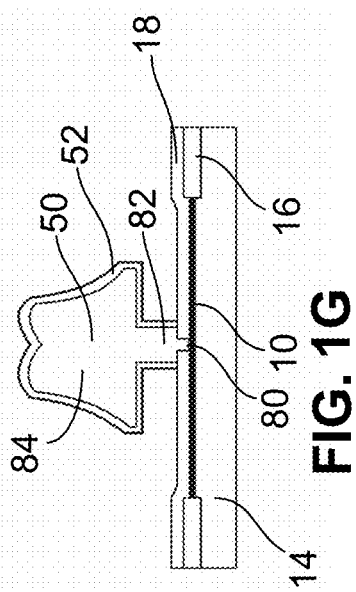

MINIATURE FIELD PLATE T-GATE AND METHOD OF FABRICATING THE SAME

CROSS-REFERENCE TO RELATED APPLICATIONS

This application is a divisional of U.S. patent application Ser. No. 16/773,090, filed Jan. 27, 2020, which is related to and claims priority from U.S. Provisional Application Ser. No. 62/829,192, filed Apr. 4, 2019, the disclosures of which are incorporated herein as though set forth in full.

STATEMENT REGARDING FEDERAL FUNDING

This invention was made under U.S. Government contract FA8650-18-C-7802. The U.S. Government has certain rights in this invention.

TECHNICAL FIELD

This disclosure relates to high electron mobility transistors (HEMTs).

BACKGROUND

AlGaN/GaN high electron mobility transistors (HEMTs) are promising for high frequency transistors because of their two dimensional electron gas (2DEG) with high electron saturation velocity and high electron concentration. These HEMTs can also provide high power transistors due to the high critical breakdown field of GaN. However, in general, field effect transistors under high voltage operation suffer from high electric fields at the drain edge of the gate leading to the breakdown of transistors and/or an increased dynamic on-resistance during high voltage switching operation. In order to reduce the maximum electric field intensity, field plate structures are widely used. One drawback of a field plate structure is that it increases the gate capacitance and has an adverse effect on cutoff-frequency (fT) and maximum frequency (fmax).

In the prior art, gates have been used that are conformal to the field plate dielectric, resulting in a higher-than-necessary capacitance. The prior art has described devices with one or multiple field plates. Traditionally, a longer field plate will help suppress traps across the gate-drain region, but the drastic increase in capacitance greatly inhibits high frequency operation.

References [1] to [5], below, which are incorporated herein by reference, describe prior art field plate structures.

REFERENCES

The following references are incorporated herein as though set forth in full.
[1] Y. Pei, Z. Chen, D. Brown, S. Keller, S. P. Denbaars, and U. K. Mishra "Deep-Submicrometer AlGaN/GaN HEMTs With Slant Field Plates", IEEE Electron Device Letters, vol 30, no. 4, pp. 328-330, April 2009.
[2] K. Kobayashi, S. Hatakeyama, T. Yoshida, D. Piedra, T. Palacios, T. Otsuji, and T. Suemitsu "Current Collapse Suppression in AlGaN/GaN HEMTs by Means of Slant Field Plates Fabricated by Multi-layer SiCN", Solid State Electronics, vol 101, pp. 63-69, November 2014.
[3] G. Xie, E. Xu, J. Lee, N. Hashemi, F. Fu, B. Zhang, and W. Ng, "Breakdown voltage enhancement for power AlGaN/GaN HEMTs with Air-bridge Field Plate", 2011 IEEE International Conference of Electron Devices and Solid-State Circuits, 17-18 Nov. 2011.
[4] J. Wong, K. Shinohara, A. Corrion, D. Brown, Z. Carlos, A. Williams, Y. Tang, J. Robinson, I. Khalaf, H. Fung, A. Schmitz, T. Oh, S. Kim, S. Chen, S. Burnham, A. Margomenos, and M. Micovic, "Novel Asymmetric Slant Field Plate Technology for High-Speed Low-Dynamic Ron E/D-mode GaN HEMTs", IEEE Electron Device Letters, vol. 38, no. 1, pp. 95-98, January 2017.
[5] D. Brown, K. Shinohara, A. Corrion, R. Chu, A. Williams, J. Wong, I. Alvarado-Rodriguez, R. Grabar, M. Johnson, C. Butler, D. Santos, S. Burnham, J. Robinson, D. Zehnder, S. Kim, T. Oh, M. Micovic, "High-Speed, Enhancement-Mode GaN Power Switch With Regrown n+ GaN Ohmic Contacts and Staircase Field Plates", IEEE Electron Device Letters, vol. 34, no. 9, pp. 1118-1120, September 2013.

What is needed is an improved transistor structure that provides high-frequency operation, low dynamic on-resistance, reduced parasitic capacitance and high-voltage operation. The embodiments of the present disclosure answer these and other needs.

SUMMARY

In a first embodiment disclosed herein, a method of fabricating a gate with a mini field plate for a transistor comprises forming a dielectric passivation layer over an epitaxy layer on a substrate, coating the dielectric passivation layer with a first resist layer, etching the first resist layer and the dielectric passivation layer to form a first opening in the dielectric passivation layer, removing the first resist layer, and forming a tri-layer gate having a gate foot in the first opening, the gate foot having a first width, a gate neck extending from the gate foot and extending for a length over the dielectric passivation layer on both sides of the first opening, the gate neck having a second width wider than the first width of the gate foot, and a gate head extending from the gate neck, the gate head having a third width wider than the second width of the gate neck.

In another embodiment disclosed herein, a transistor having a gate with a mini field plate comprises a substrate, an epitaxy layer on the substrate, a dielectric passivation layer on the epitaxy layer, a first opening in the dielectric passivation layer, and a tri-layer gate, the tri-layer gate comprising a gate foot in the first opening, the gate foot having a first width, a gate neck extending from the gate foot and extending for a length over the dielectric passivation layer on both sides of the first opening, the gate neck having a second width wider than the first width of the gate foot, and a gate head extending from the gate neck, the gate head having a third width wider than the second width of the gate neck.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 1A, 1B, 1C, 1D, 1E, 1F and 1G show a mini field plate gate fabrication process in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes a transistor that combines the benefit of a high fT and fmax T-gate structure with a short field plate to increase the performance of radio frequency (RF) GaN transistors. The field plate closest to the 2DEG has the greatest effect in reducing dynamic on-resistance. In the present disclosure a small or "mini" field plate is used to spread the electric field while retaining a relatively low gate parasitic capacitance. Additionally, the transistors of the present disclosure have a higher manufacturing yield and better repeatability due to a mechanically stronger gate neck.

Figure 3:
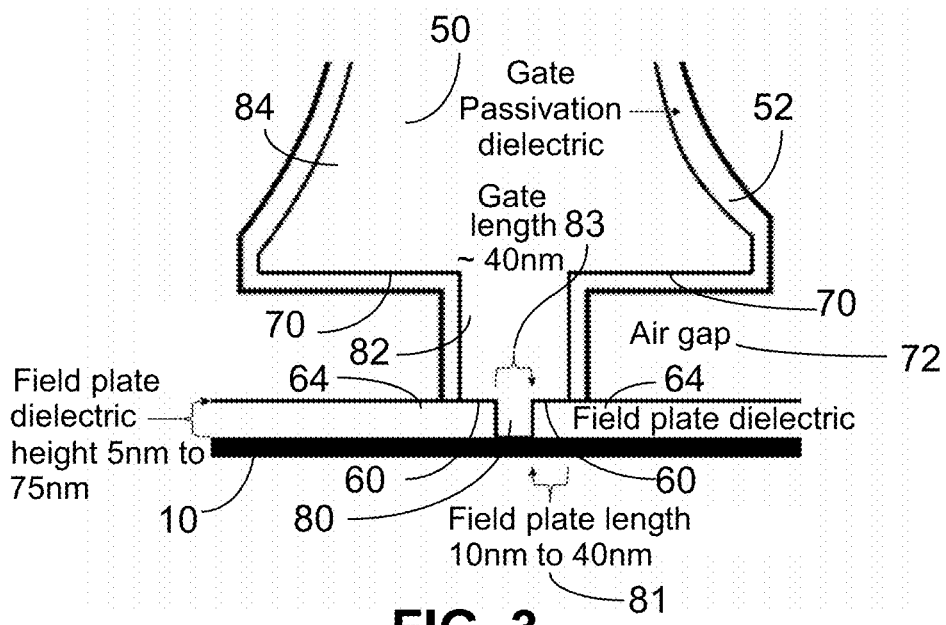
FIG. 3 shows dimensions of the gate and field plate length and field plate dielectric thickness in accordance with the present disclosure.

The miniature field plates 60 are at the edges of the gate foot 80, as best shown in FIG. 3, to reduce the peak electric field while leaving an air-gap between the bulk of the T-gate head and the underlying semiconductor structures to reduce the parasitic capacitance. Process time may be slightly increased compared to a prior art GaN T-gate process, but because of the mini field plate, the gate stem or gate neck thickness increases, allowing for a more mechanically robust T-gate. By combining a lift-off T-gate with a mini field plate structure, devices made according to the present disclosure can obtain the benefits of a field plate while improving high-frequency operation.

The presently disclosed transistor may be a tri-layer gate and a dielectric is used split the gate process into two individual lithographic steps to obtain a small gate length or width, which may be 40 nanometers or less, as shown in FIG. 3, while improving the electric field profile and minimizing gate capacitance to achieve high frequency operation. Most prior art devices with field plates are for low frequency applications and operation and have a large (>100 nm) gate foot.

FIGS. 1A, 1B, 1C, 1D, 1E, 1F and 1G show a mini field plate gate fabrication process in accordance with the present disclosure. The process illustrates a process flow for GaN-based HEMTs, but the process and the features of the invention herein described are not limited to GaN. Other semiconductor materials such as GaAs, InP, Si, and InSb may be used as well.

Figure 1A:
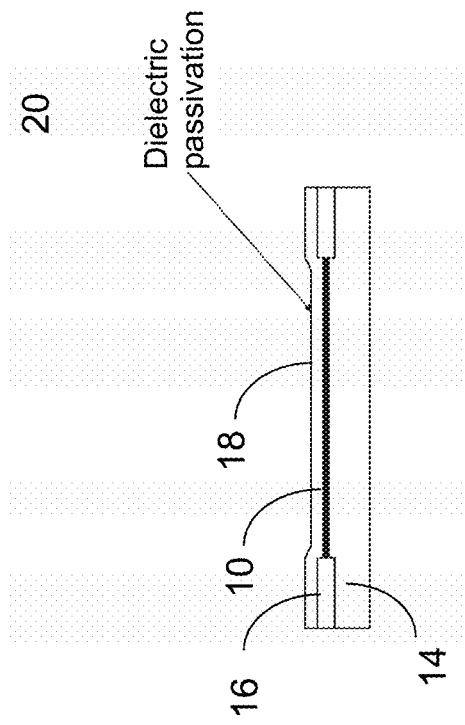

The fabrication steps are as follows. As shown in FIG. 1A an epitaxy layer 10, which may include an AlGaN barrier layer 12, is grown for a HEMT structure on a suitable substrate 14, which is shown as GaN, but which could also be sapphire, silicon carbide (SiC), silicon (Si), GaAs, InP, or InSb. Then, ohmic contacts 16 are formed. A preferred embodiment for the formation of ohmic contacts is by an n+ GaN regrowth process, which may be performed to provide low resistance ohmic contacts 16.

Figure 1B:
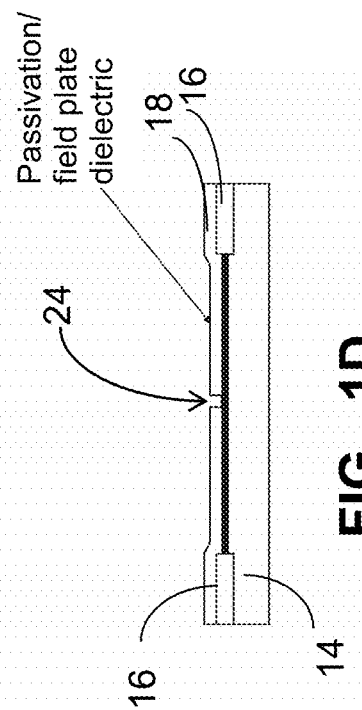

Then, as shown in FIG. 1B, a dielectric passivation layer 18 may be formed over the structure using, for example, chemical vapor deposition (CVD), plasma enhanced CVD (PECVD) or atomic layer deposition (ALD). The dielectric may be $Al_2O_3$, $Si_3N_4$ or $SiO_2$.

Figure 1C:
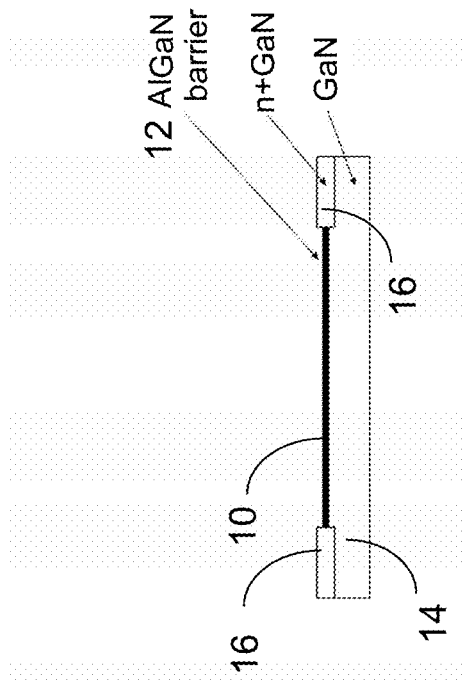

Next, as shown in FIG. 1C, an electron-beam (E-beam) resist 20 may be coated over the structure, followed by gate foot patterning, and etching an E-beam defined gate foot pattern 22 through the resist 20 and the dielectric passivation layer 18, and stopping at the epitaxy layer 10. A dry etch process is preferable, because a wet etch is much harder to control. The chemistry depends on the dielectric, but fluorine- or chlorine-based dry etches are generally applicable. In a preferred embodiment, CF4 may be used.

Figure 1D:
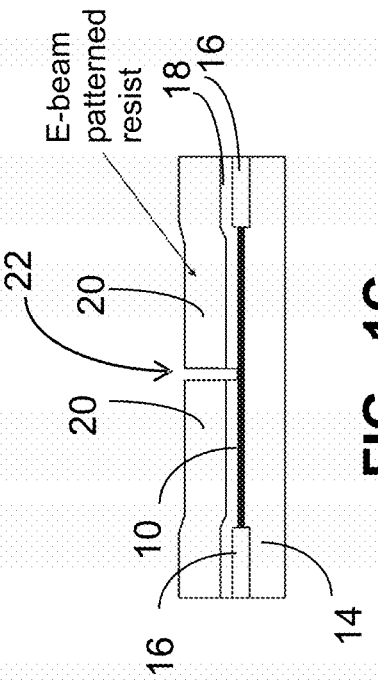

Then as shown in FIG. 1D, the resist 20 is removed, leaving opening 24 in the dielectric passivation layer 18. The resist may be removed using a solvent bath.

Next, as shown in FIG. 1E, another E-beam process is performed to define a tri-layer gate 50 (see FIGS. 1F and 1G) on top of opening 24. This process starts by depositing resist 26 over the device, which is typically one of a plurality of identical devices fabricated simultaneously on a wafer or substrate. The resist is preferentially deposited by a spin-coat process, then patterned using typical lithographic techniques. The result of the patterning is an opening 28 in the resist above the opening 24. The opening 28 has a larger lateral dimension than the opening 24. In the embodiment displayed in FIGS. 1E-1G, the opening 28 is shown as centered above the opening 24; however, in general, the two openings need not be centered with respect to one another.

Then another E-beam resist 30 is deposited on the resist 26 on either side of the opening 28, so that the E-beam resist 30 has an opening 32, which is wider than opening 28. Then another E-beam resist 34 is deposited on the resist 30 on either side of the opening 32, so that the E-beam resist 34 has an opening 36, which is wider than opening 28, but narrower than opening 32.

Other lithography techniques may be used, as long as the feature resolution can be obtained. The top and bottom resists may be ZEP, and the middle may be PMGI; alternatively, the top and bottom may be PMMA and the middle may be MMA. Other stacks may be used, as long as the middle resist has a selective developer relative to the top and bottom, and the features can be resolved.

Then, as shown in FIG. 1F, metal 38 is evaporated to form tri-layer gate 50. The metal 38 may be Ni, Ti, Pt, W, TaN, or TiN. The gate may also be composed of more than one metal. Typically, the bottom of the gate stack is a metal with a high work function; the remainder can be any low resistance metal. In a preferred embodiment, the bottom 20 nm is Pt and the remainder is Au.

As shown in FIG. 1F the metal 38 fills openings 24 and 28 and partially fills opening 32. The metal 38 coats a portion of the top of dielectric passivation layer 18, which forms field plates 70, as further described below. The metal 38 also coats a portion of the top of resist 26 and resist 34.

The shape of gate 50 and of the metal 38 on resist 34 is an artifact and feature of the method of metal deposition. That is, the pattern of metal deposition is a result of the metal having been thermally evaporated. Other deposition techniques such as chemical vapor deposition, atomic layer deposition, or other techniques could result in a different gate 50 shape.

Then, as shown in FIG. 1G, the resists 26, 30 and 34 are removed along with the metal 38 coated on resist 34. This step may be performed using a metal lift-off process using a solvent, such as acetone, isopropyl alcohol, or PRS.

Finally, as shown in FIG. 1G, a dielectric 52 may optionally be deposited over the tri-layer gate 50 and would also typically cover the surface of dielectric 18. Dielectric 52 may be deposited by PECVD or ALD or even sputtering.

As shown in FIG. 1G the tri-layer gate 50 has a gate foot 80, a gate neck 82 and a gate head 84.

Figure 2:
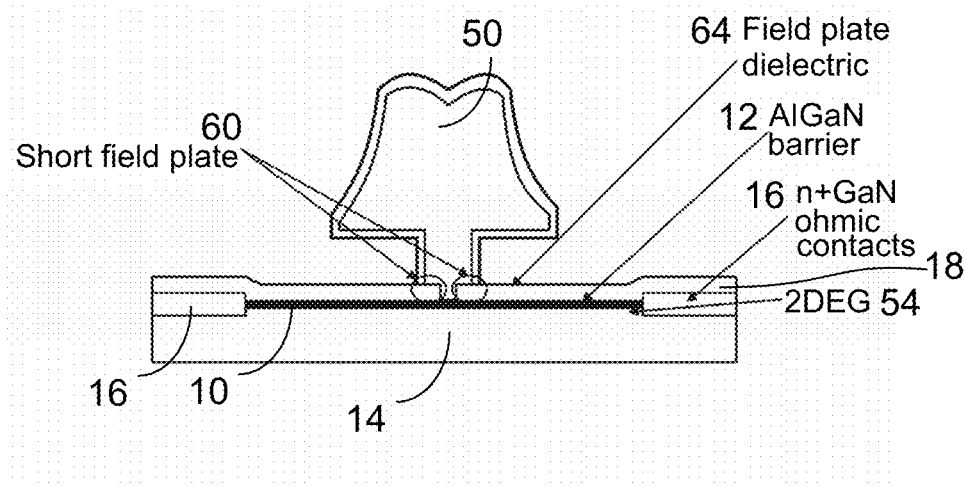
FIG. 2 shows the locations of the short/mini field plate in accordance with the present disclosure.

FIG. 2 shows the locations of the short/mini field plates 60 that are formed by the tri-layer gate 50. The width of the short/mini field plates 60 are defined by the difference between the width of opening 24 and the width of opening 28, which as described above has a greater width than opening 24. Also shown in FIG. 2 is the two dimensional electron gas (2DEG) 54 which forms below the barrier layer 12 in a GaN-based HEMT.

FIG. 3 shows a dimension of the gate foot 80, which may have a length or width 83 of 40 nanometers or less. The gate foot 80 is formed in opening 24. The length 81 of the mini field plates 60 may range from 10 nanometers to 40 nanometers length. The mini field plates 60 may have different lengths. For example, a mini field plate 60 may be longer on the side toward a drain for a transistor. The field plate dielectric 64 is the portion of the dielectric 18 that is under the mini field plates 60. As shown, the height of the mini field plate 60 above the epitaxy layer 10 may be 5 nanometers to 75 nanometers.

The field plates 70, which are part of tri-layer gate 50, are formed when metal 38 is evaporated and coats a portion of the top of resist 26. The field plates 70 are separated from the field plate dielectric 64 by air gap 72, which may be 10 nm to 200 nm in height. The length of the field plates 70 may be one half the gate head 84 width minus one half the gate neck 82 width. The gate head 84 width is greater than the width of gate neck 82.

The mini field plates 60, which are supported by field plate dielectric 64, provide a stronger gate foot 80 than the gate foot in prior art T-gate structures, because in prior art T-gate structures the gate foot extends all the way up from the epitaxy layer to the gate head, which results in a weak gate foot. In the present disclosure, the width of the gate neck 82 from the top of the gate foot 80, which may be 5 nm to 75 nm above the epitaxy layer 10, to the bottom of the gate head 84 is roughly 3 times wider than the gate foot and supported by field plate dielectric 64, as shown in FIG. 3, thereby greatly increasing the mechanical strength of the gate. The result is higher yield devices and better repeatability.

HEMT transistors fabricated according to the present disclosure improve the electric field profile and minimize gate capacitance, which provides for high frequency operation.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ".

What is claimed is:

1. A transistor having a gate with a mini field plate comprising:
   a substrate;
   an epitaxy layer on the substrate;
   a dielectric passivation layer on the epitaxy layer;
   a first opening in the dielectric passivation layer;
   a tri-layer gate, the tri-layer gate comprising:
      a gate foot in the first opening, the gate foot having a first width;
      a gate neck extending from the gate foot and extending for a length over the dielectric passivation layer on both sides of the first opening, the gate neck having a second width wider than the first width of the gate foot; and
      a gate head extending from the gate neck, the gate head having a third width wider than the second width of the gate neck;
   wherein the gate head having a third width wider than the second width of the gate neck comprises:
      a third field plate on one side of the gate neck; and
      a fourth field plate on another side of the gate neck;
      wherein the third field plate is separated from the dielectric passivation layer by an air gap; and
      wherein the fourth field plate is separated from the dielectric passivation layer by an air gap;
   the transistor comprising a dielectric over the tri-layer gate.

2. The transistor of claim 1 further comprising ohmic contacts.

3. The transistor of claim 1 wherein the substrate comprises GaN, sapphire, silicon carbide (SiC), silicon (Si), GaAs, InP, or InSb.

4. The transistor of claim 1 wherein the epitaxy layer comprises an AlGaN barrier layer.

5. The transistor of claim 1 wherein the transistor comprises a high electron mobility transistor.

6. The transistor of claim 1:
   wherein the gate neck extending for a length over the dielectric passivation layer on both sides of the first opening comprises:
      a first mini field plate on one side of the first opening; and
      a second mini field plate on another side of the first opening.

7. The transistor of claim 6:
   wherein the first mini field plate has a width of 10 nanometers to 40 nanometers; and
   wherein the second mini field plate has a width of 10 nanometers to 40 nanometers.

8. The transistor of claim 6:
wherein the height of the first mini field plate above the epitaxy layer is 5 nanometers to 75 nanometers; and
wherein the height of the second mini field plate above the epitaxy layer is 5 nanometers to 75 nanometers.

9. The transistor of claim 1 wherein the dielectric passivation layer has a thickness of 5 nanometers to 75 nanometers.

10. The transistor of claim 1 wherein the gate foot has a width of 40 nanometers or less.

\* \* \* \* \*